US011930636B2

(12) United States Patent
Wieduwilt et al.

(10) Patent No.: US 11,930,636 B2
(45) Date of Patent: Mar. 12, 2024

(54) TRANSISTOR ANTIFUSE, AND RELATED DEVICES, SYSTEMS, AND METHODS

(71) Applicant: Micron Technology, Inc., Boise, ID (US)

(72) Inventors: Christopher G. Wieduwilt, Boise, ID (US); James S. Rehmeyer, Boise, ID (US); Toshihiko Miyashita, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/468,523

(22) Filed: Sep. 7, 2021

(65) Prior Publication Data
US 2023/0074975 A1   Mar. 9, 2023

(51) Int. Cl.
*H10B 20/20* (2023.01)
*G11C 17/16* (2006.01)
*G11C 17/18* (2006.01)

(52) U.S. Cl.
CPC .............. *H10B 20/20* (2023.02); *G11C 17/16* (2013.01); *G11C 17/18* (2013.01)

(58) Field of Classification Search
CPC ...................................... G11C 17/16
USPC ............................................................ 365/96
See application file for complete search history.

(56) References Cited

U.S. PATENT DOCUMENTS

| | | | | |
|---|---|---|---|---|
| 5,495,436 A | * | 2/1996 | Callahan | G11C 17/18 365/96 |
| 9,905,309 B2 | * | 2/2018 | Bang | G11C 17/16 |
| 10,984,878 B1 | * | 4/2021 | Chang | G11C 11/4094 |
| 2010/0232203 A1 | * | 9/2010 | Chung | H01L 23/5252 365/96 |
| 2011/0075500 A1 | * | 3/2011 | Kodama | G11C 17/18 365/225.7 |
| 2019/0304906 A1 | * | 10/2019 | Dorgan | G11C 11/40 |

* cited by examiner

*Primary Examiner* — Muna A Techane
(74) *Attorney, Agent, or Firm* — TraskBritt

(57) ABSTRACT

Transistor antifuses are disclosed. An apparatus may include an antifuse that may be configurable either as a short between a first node and a second node or as an open between the first node and the second node. The antifuse may include a selection transistor and an antifuse transistor. A source or drain of the selection transistor may be electrically coupled to the first node. A gate of the selection transistor may be configured to receive a selection voltage. A gate of the antifuse transistor may be electrically coupled the other of the source or drain of the selection transistor. A source or drain of the antifuse transistor may be electrically coupled to the second node. Associated devices, systems, and methods are also disclosed.

18 Claims, 14 Drawing Sheets

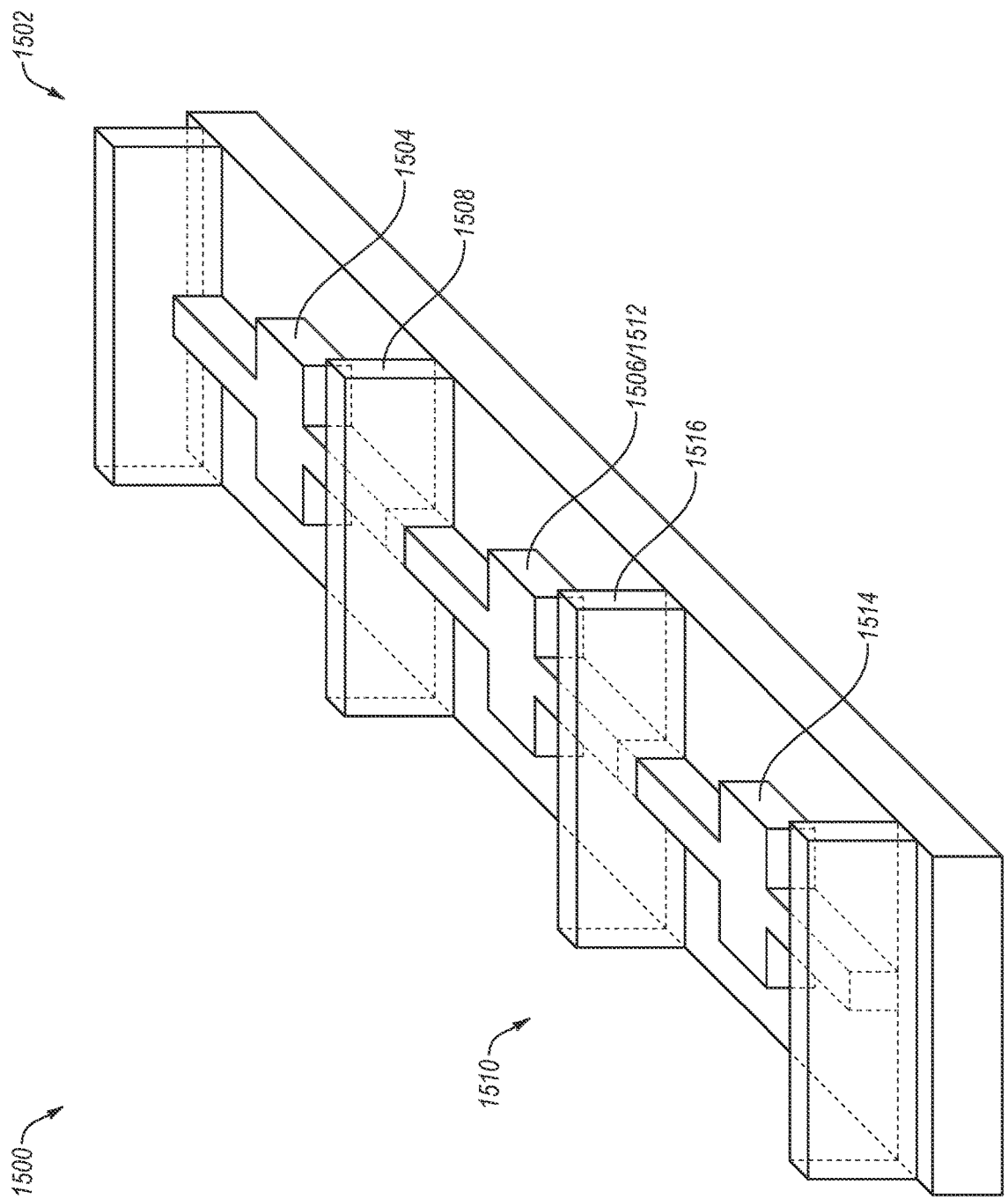

TRANSISTOR ANTIFUSE, AND RELATED DEVICES, SYSTEMS, AND METHODS

TECHNICAL FIELD

Embodiments of the disclosure relate to antifuses. More specifically, various embodiments relate to transistor antifuses, and related methods, devices, and systems.

BACKGROUND

An antifuse is a device that allows electrical current to flow (i.e., as if the antifuse were a wire) or prevents electrical current from flowing (i.e., as if the antifuse were an open circuit). In an initial state, an antifuse may prevent electrical current from flowing through the antifuse i.e., the antifuse may function in a circuit as an open circuit. If a voltage difference across the antifuse exceeds a threshold, the antifuse will breakdown. Thereafter the antifuse will allow electrical current to flow through the antifuse with little or no resistance i.e., the antifuse may function in the circuit as a wire.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 15 is a three-dimensional layout diagram illustrating yet another example antifuse in accordance with at least one embodiment of the disclosure.

DETAILED DESCRIPTION

Figure 1:
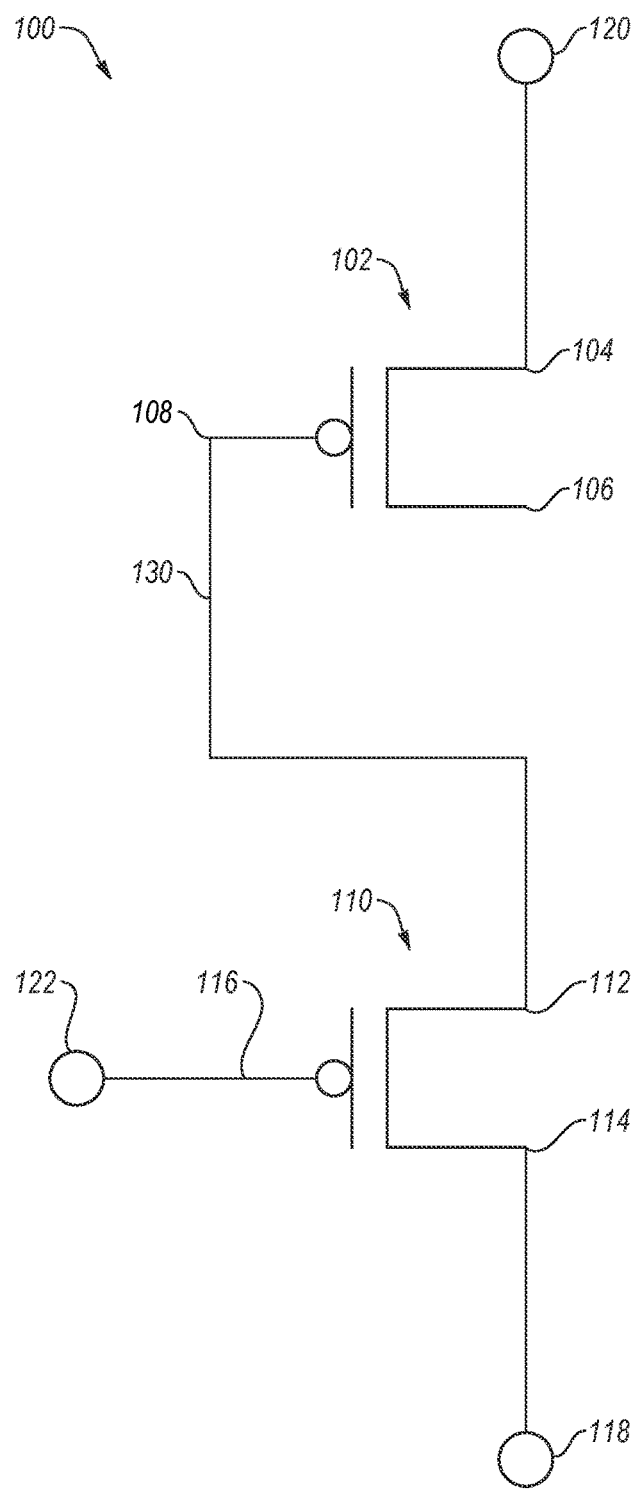
FIG. 1 is a schematic diagram illustrating an example antifuse in accordance with at least one embodiment of the disclosure.

An antifuse is a device that allows electrical current to flow with little or no resistance (i.e., as if the antifuse were a wire, a short circuit, or a "short") or prevents electrical current from flowing (i.e., as if the antifuse were an open circuit or an "open"). For example, in an initial state, an antifuse may prevent electrical current from flowing through the antifuse i.e., the antifuse may function in the circuit as an open. If a voltage difference across the antifuse exceeds a threshold, the antifuse will break down (or "blow"). Thereafter the antifuse will allow electrical current to flow through the antifuse with little or no resistance i.e., the antifuse may function in the circuit as a short.

Antifuses can be used, among other things, as programmable read-only memory. For example, one antifuse can be used to store one bit of data. For example, one antifuse can be programmed (e.g., altered, modified, or blown from its initial state to a blown state or alternatively not altered from its initial state). Thereafter a state of the antifuse may be determined in order to read the bit of data. The term "reading" in reference to an antifuse refers to determining a state of the antifuse by measuring voltage or current between a first node coupled to the antifuse and a second node coupled to the antifuse. The term "writing" in reference to an antifuse may include providing a voltage differential between the first node and the second node sufficient to alter the antifuse (i.e., from being as an open to being as a short). The use of the terms "program," "read," and "write" are for brevity and do not limit embodiments of the present disclosure to memory applications.

In some cases, antifuses may be used in microelectronic devices (e.g., memory devices) to store permanent manufacturing settings (e.g., settings for timing adjustments, voltage adjustments, and/or function adjustments) or to store permanent repair settings (e.g., defective addresses that should be swapped for a redundant element or enable settings for various redundant elements). In some cases, antifuses may be implemented on a semiconductor die, providing for storage on the semiconductor die.

Embodiments described herein may include antifuses, circuits, or systems including antifuses, and/or methods of reading and/or writing antifuses. Embodiments may represent or exhibit improvements over conventional antifuses at least in terms of how antifuses are written. For example, antifuses may be written using voltages that are preferable to voltages used to write other antifuses. As another example, antifuses may be written more consistently than other antifuses. Additionally or alternatively, embodiments may represent or exhibit improvements over conventional antifuses at least in terms of how antifuses are read. For example, the manner in which antifuses are written could result in lower resistance in the breakdown path, thus making it easier to read the antifuses when compared with other antifuses. Additionally or alternatively, embodiments may represent or exhibit improvements over conventional antifuses at least in terms of size and/or area. For example, antifuses could be smaller or take up less space on a semiconductor die than other antifuses.

Some embodiments include an antifuse configured to be read as either a short between a first node and a second node or as an open between the first node and the second node. Additionally or alternatively, the antifuse may be configurable either as a short between the first node and the second node or as an open between the first node and the second node. The antifuse may include one or more transistors. In particular, the antifuse may include an antifuse transistor and a selection transistor coupled between the first node and the second node. A source or drain of the selection transistor may be electrically coupled to the first node. A gate of the selection transistor may be configured to receive a selection voltage. A gate of the antifuse transistor may be electrically coupled to the other of the source or drain of the selection transistor. A source or drain of the antifuse transistor may be electrically coupled to the second node.

The selection voltage may be applied to the antifuse to cause the antifuse to be readable or writable. For example, in some cases, the antifuse may be part of an array of antifuses all coupled between two nodes (e.g., buses). Each of the antifuses of the array may be individually selectable e.g., by application of a selection voltage to the selected antifuse of the array.

Transistors described herein may have a source, a drain, and a gate. In the disclosure, unless otherwise specified, the source and drain may be interchangeable. Thus, in the disclosure reference may be made to a "source or drain" of a transistor and the "other of the source or drain" of the transistor. Alternatively, the in disclosure, reference may be made to a "source or drain" having a first reference number (e.g., source or drain 104) and a "source or drain" having a second reference number (e.g., source or drain 106).

Some embodiments include antifuses including fin fieldeffect transistors (finFETs). FinFETs may include a channel region (i.e., between a source region and a drain region) that is surrounded on multiple sides by a gate region. For example, the channel region may protrude between gate regions. In some cases, antifuses including finFETs may be advantageous compared with antifuses including planar transistors. For example, in cases where finFET devices (e.g., transistors of a memory device) are being manufactured on a die (or FinFET processes are being used), it may be advantageous (e.g., more simple or more cost effective) to manufacture the antifuses to include finFETs instead of antifuses including planar transistors. Additionally or alternatively, finFET-antifuse breakdown paths may be similar to traditional planar-MOS antifuse breakdown paths, or finFET antifuses may exhibit other breakdown paths made possible by the geometry of the channel region and physics of the finFET antifuses. As an example, a finFET antifuse may exhibit a gate oxide breakdown in the fin corner region (upper corner edge of the channel) or the bottom fin edge.

Some embodiments include antifuses including p-channel metal-oxide semiconductor (PMOS) transistors. PMOS transistors sit in n-type silicon, which has a majority carrier of electrons. Due to the shape of finFETs, electrons in the channel region (PMOS accumulation region) may provide for more successful (e.g., consistent) writing and/or reading. PMOS transistors may be advantageous for antifuse devices when used in conjunction with FinFET complementary metal-oxide semiconductor (CMOS), due to the significant improvement in PMOS mobility.

Although various embodiments are described herein with reference to memory devices, the disclosure is not so limited, and the embodiments may be generally applicable to microelectronic systems and/or semiconductor devices that may or may not include memory devices. Embodiments of the disclosure will now be explained with reference to the accompanying drawings.

FIG. 1 is a schematic diagram illustrating an example antifuse 100 in accordance with at least one embodiment of the disclosure. Antifuse 100 may be configurable as either a short between a first node 118 and a second node 120 or an open between first node 118 and second node 120. Antifuse 100 may include an antifuse transistor 102 and a selection transistor 110 coupled between first node 118 and second node 120.

Selection transistor 110 may include a source or drain 112, a source or drain 114, and a gate 116. Source or drain 114 may be electrically coupled to first node 118. Gate 116 may be configured to receive a selection voltage (e.g., a voltage configured to cause antifuse 100 to be accessible e.g., readable and/or writable) from a selection node 122. Gate 116 may be configured such that the selection voltage at gate 116 causes selection transistor 110 to close e.g., allowing current to flow from source or drain 114 to source or drain 112.

Figure 2:
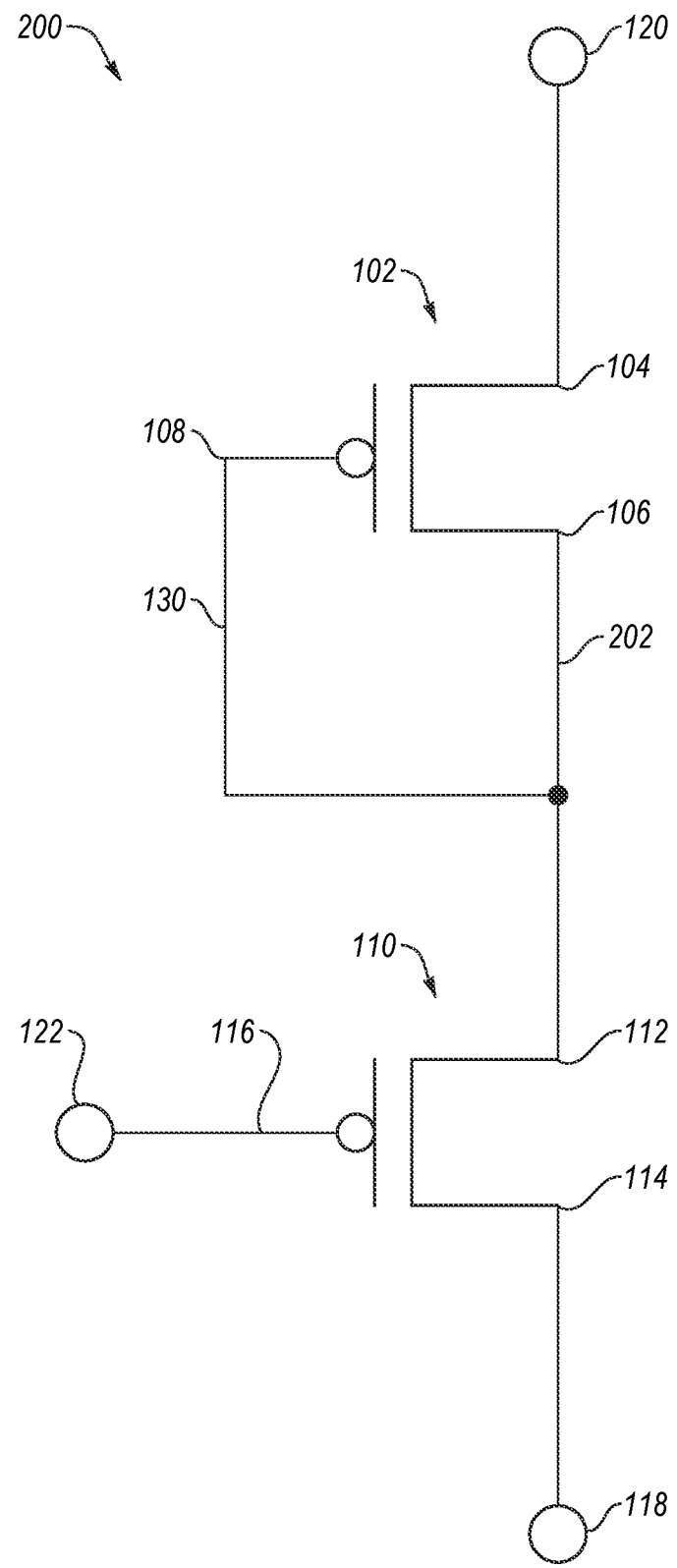
FIG. 2 is a schematic diagram illustrating another example antifuse in accordance with at least one embodiment of the disclosure.
Figure 3:
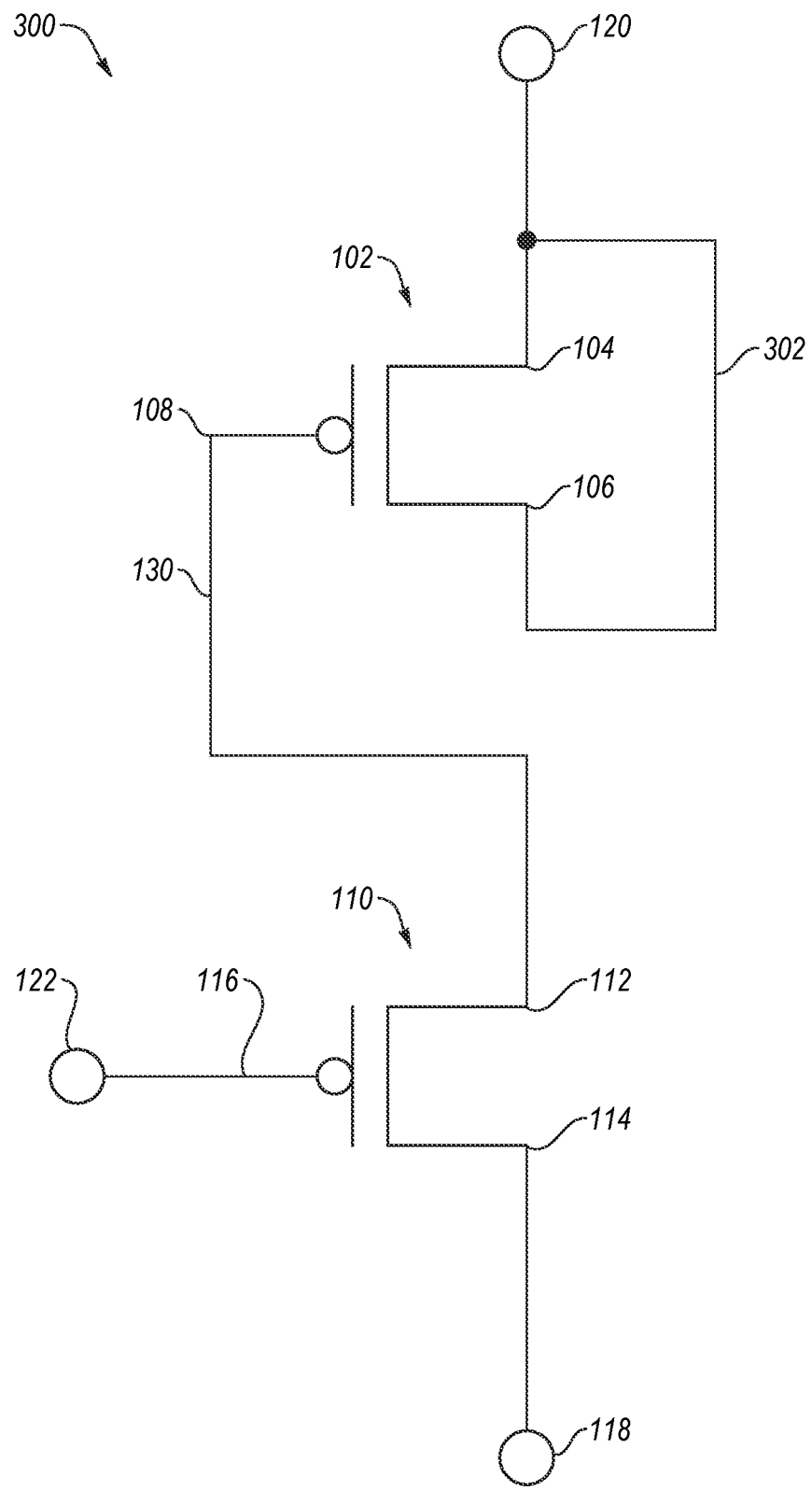
FIG. 3 is a schematic diagram illustrating yet another example antifuse in accordance with at least one embodiment of the disclosure.

Antifuse transistor 102 may include a source or drain 104, a source or drain 106, and a gate 108. Gate 108 may be electrically coupled to source or drain 112 of selection transistor 110 by coupling 130. Coupling 130 may be, or may include, an interconnect jumper e.g., in one or more metal or polysilicon layers of antifuse 100. Source or drain 104 of antifuse transistor 102 may be electrically coupled to second node 120. In some embodiments, source or drain 106 may be floating. In other embodiments, source or drain 106 may be electrically coupled to source or drain 112 of selection transistor 110 and to gate 108 of antifuse transistor 102 as illustrated in FIG. 2. In still other embodiments source or drain 106 may be electrically coupled to source or drain 104 and to second node 120 as illustrated in FIG. 3.

Antifuse 100 may be configured as an open if antifuse transistor 102 is in its initial state, i.e., a normal operational state. Antifuse 100 may be configured as a short if antifuse transistor 102 is altered i.e., if a dielectric of a channel region of antifuse transistor 102 has broken down e.g., if antifuse transistor 102 has been blown. If antifuse transistor 102 is in its initial state, antifuse transistor 102 may be configured to prevent flow of current from gate 108 to source or drain 104. However, if antifuse transistor 102 has been altered (also referred to herein as "modified" or "blown") (e.g., by application of electrical voltage to gate 108 and source or drain 104 sufficient to cause a breakdown of the dielectric of the channel region of antifuse transistor 102), antifuse transistor 102 may allow current to flow between gate 108 to source or drain 104.

The process of determining a state of antifuse 100 (e.g., reading antifuse 100) may include providing a known voltage at one or both of first node 118 and second node 120, providing a selection voltage at selection node 122, and observing a voltage and/or current at one or both of first node 118 and second node 120. The selection voltage at selection node 122 may cause selection transistor 110 to close, electrically coupling source or drain 114 to source or drain 112, and by extension, first node 118 to gate 108. If antifuse transistor 102 has not been altered, antifuse transistor 102 will prevent the flow of current between gate 108 and source or drain 104 (and, by extension between first node 118 and second node 120 (e.g., when selection transistor 110 is closed e.g., by the application of the selection voltage to gate 116)). If antifuse transistor 102 has been altered, antifuse transistor 102 will allow current to flow from gate 108 to source or drain 104, thereby effectively electrically coupling first node 118 to second node 120 (when selection transistor 110 is closed). Thus, the process of observing the state of antifuse 100 may include providing a selection voltage at selection node 122 and a known voltage at one or both of first node 118 and second node 120, then observing voltage and/or current at or between first node 118 and second node 120 to determine whether antifuse transistor 102 has been altered or not (e.g., based on an electrical coupling between first node 118 and second node 120).

The process of programming (also referred to herein as "modifying" or "writing") a state of antifuse 100 by altering or blowing antifuse transistor 102 may include providing a high voltage differential between first node 118 and second node 120 and the selection voltage at selection node 122. The selection voltage at selection node 122 may cause selection transistor 110 to close, electrically coupling source or drain 114 to source or drain 112, and by extension, first node 118 to gate 108. With the high voltage differential between first node 118 and second node 120 and with selection transistor 110 closed, there may be a high voltage differential between gate 108 and source or drain 104. The high voltage differential may be suitable to cause a breakdown of a dielectric of a channel region of antifuse transistor 102. The breakdown may cause antifuse transistor 102 to allow current flow between gate 108 and source or drain 104.

The high voltage differential may include application of a high voltage at first node 118 and a low voltage at second node 120. In some embodiments, the high voltage may be between substantially 1 volt and substantially 10 volts higher than the low voltage. In some embodiments, the high voltage may be between substantially 2.5 volts and substantially 7.5 volts higher than the low voltage. In some embodiments, the high voltage may be between substantially 4 volts and substantially 6 volts higher than the low voltage. In some embodiments, the high voltage may be substantially 5 volts higher than the low voltage.

In some embodiments, antifuse transistor 102 and/or selection transistor 110 may be PMOS transistors. In cases where antifuse transistor 102 is a PMOS transistor, and a high voltage is applied to first node 118 and a low voltage to second node 120, antifuse transistor 102 may be altered while antifuse transistor 102 is in accumulation mode.

Figure 5:
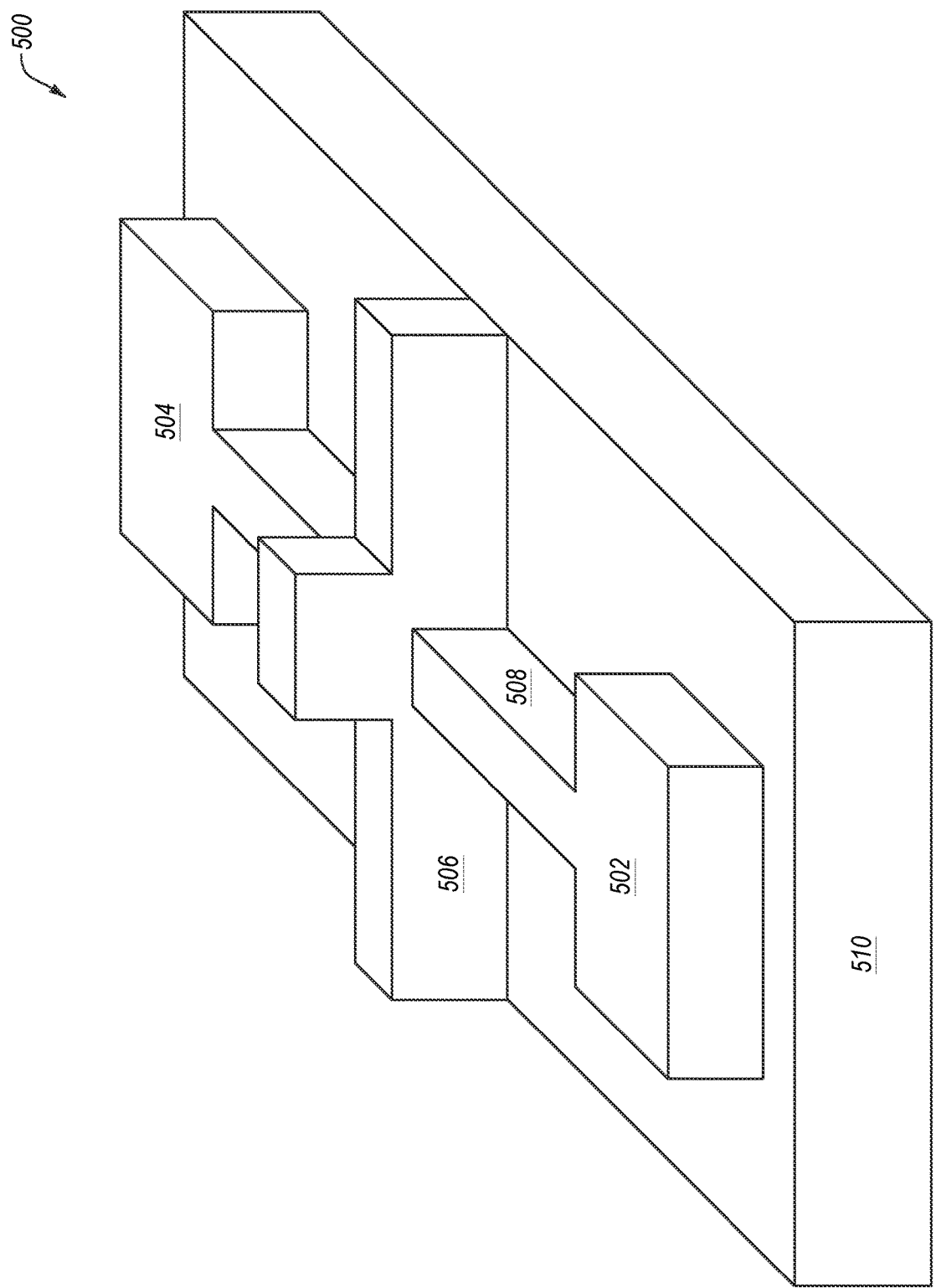
FIG. 5 is a three-dimensional layout diagram illustrating an example fin field-effect transistor in accordance with at least one embodiment of the disclosure.

In some embodiments, antifuse transistor 102 and/or selection transistor 110 may be finFET transistors (e.g., as illustrated and described with regard to FIG. 5).

FIG. 2 is a schematic diagram illustrating another example antifuse 200 in accordance with at least one embodiment of the disclosure. Antifuse 200 includes many of the same elements and electrical couplings as antifuse 100 of FIG. 1. Where elements of antifuse 200 are the same as or substantially or substantially similar to their counterparts in antifuse 100 the same numbers have been used and descriptions have been omitted.

One difference between antifuse 100 of FIG. 1 and antifuse 200 is coupling 202 which electrically couples source or drain 112 to source or drain 106. Coupling 202 may allow antifuse 200 to have a smaller size compared with other antifuses. For example, in antifuse 100 of FIG. 1, source or drain 112 of selection transistor 110 may be physically isolated from source or drain 106 of antifuse transistor 102. The physical isolation between source or drain 112 and source or drain 106 may include separated diffusion regions. In contrast, in antifuse 200 of FIG. 2 source or drain 106 of antifuse transistor 102 and source or drain 112 of selection transistor 110 may be smaller and may share a diffusion region, which may result in antifuse 200 being smaller than antifuse 100.

FIG. 3 is a schematic diagram illustrating yet another example antifuse 300 in accordance with at least one embodiment of the disclosure. Antifuse 300 includes many of the same elements and electrical couplings as antifuse 100 of FIG. 1. Where elements of antifuse 300 are the same as or substantially or substantially similar to their counterparts in antifuse 100 the same numbers have been used and descriptions have been omitted.

One difference between antifuse 100 of FIG. 1 and antifuse 300 is coupling 302 which electrically couples source or drain 104 to source or drain 106. Coupling 302 may be, or may include, an interconnect jumper e.g., in one or more metal or polysilicon layers of antifuse 300. Coupling 302, electrically coupling source or drain 104 to source or drain 106, may cause source or drain 104 and source or drain 106 to have the same voltage (e.g., at all times). Thus, when antifuse transistor 102 is being written or modified, for example, the voltage differential between source or drain 104 and gate 108 will be substantially the same as the voltage differential between source or drain 106 and gate 108. This may be beneficial when the channel region is being broken down because, for example, by shorting the low voltage to both source or drain 104 and the other of source or drain 106, the channel area vulnerable to oxide breakdown may be larger, therefore increasing the success rates of writes and reads.

Figure 4:
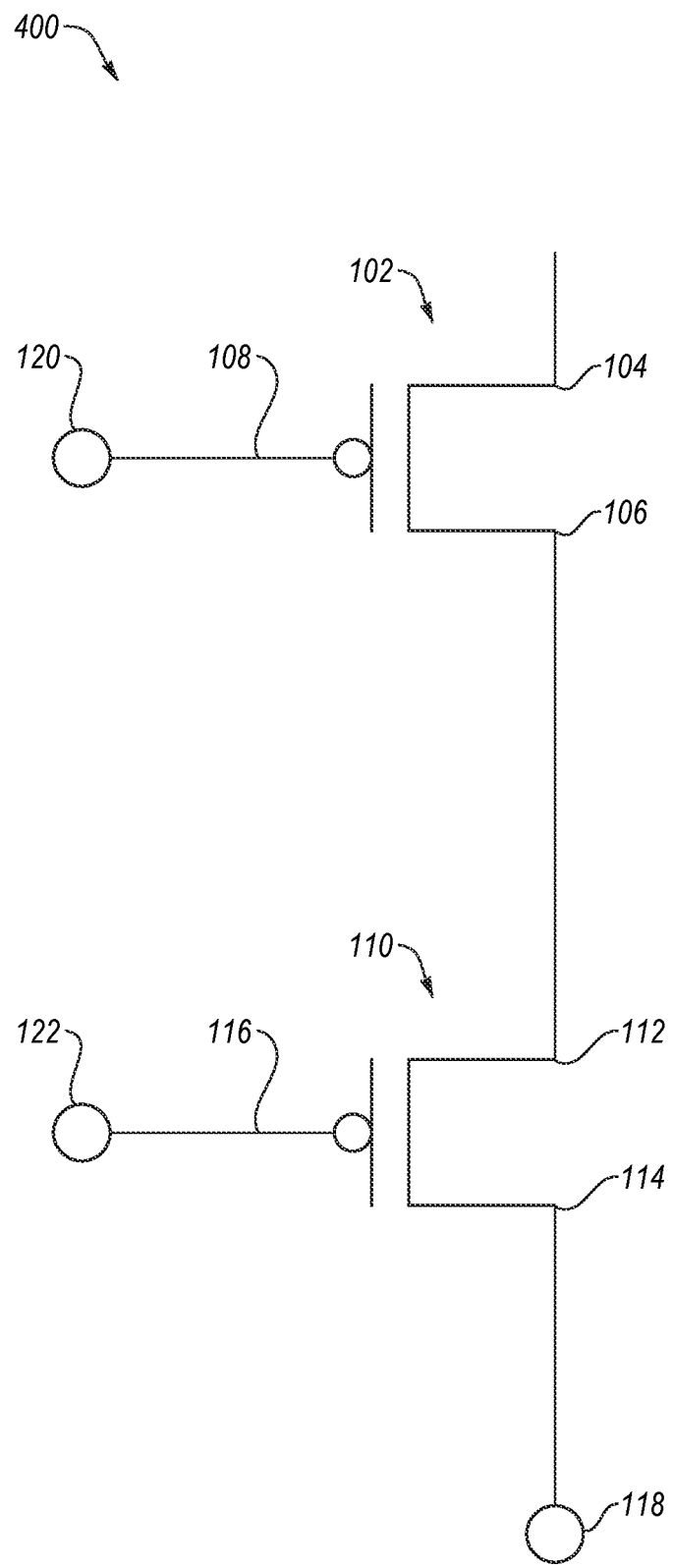
FIG. 4 is a schematic diagram illustrating yet another example antifuse in accordance with at least one embodiment of the disclosure.

FIG. 4 is a schematic diagram illustrating yet another example antifuse 400 in accordance with at least one embodiment of the disclosure. Antifuse 400 includes many of the same elements as antifuse 100 of FIG. 1. Where elements of antifuse 400 are the same as or substantially or substantially similar to their counterparts in antifuse 100 the same numbers have been used and descriptions have been omitted.

A first difference between antifuse 400 and antifuse 100 is that in antifuse 400 second node 120 is electrically coupled to gate 108 and not to source or drain 104. A second difference between antifuse 400 and antifuse 100 is that source or drain 112 is electrically coupled to source or drain 106 and not to gate 108.

Antifuse 400 may be configured to operate in much the same way as antifuse 100. For example, antifuse 400 may be read as either an open or a short between first node 118 and second node 120. Further, antifuse 400 may be written by application of a voltage differential between first node 118 and second node 120 and providing a selection voltage at selection node 122.

However, in antifuse 100, in cases in which antifuse transistor 102 is a PMOS transistor, antifuse transistor 102 may be configured to be altered (e.g., written) while antifuse transistor 102 is in accumulation mode. In contrast, in antifuse 400, in cases in which antifuse transistor 102 is a PMOS transistor, antifuse transistor 102 may be configured to be altered (e.g., written) while antifuse transistor 102 is in inversion mode.

For example, the process of programming (also referred to herein as "modifying" or "writing") a state of antifuse 400 by altering or blowing antifuse transistor 102 may include providing a high voltage differential between first node 118 and second node 120 and the selection voltage at selection node 122. The selection voltage at selection node 122 may cause selection transistor 110 to close, electrically coupling source or drain 114 to source or drain 112, and by extension, first node 118 to source or drain 106. With the high voltage differential between first node 118 and second node 120 and with selection transistor 110 closed, there may be a high voltage differential between gate 108 and source or drain 106. The high voltage differential may be suitable to cause a breakdown of a dielectric of a channel region of antifuse transistor 102. The breakdown may cause antifuse transistor 102 to allow current flow between gate 108 and source or drain 106.

The high voltage differential may include application of a high voltage at first node 118 and a low voltage at second node 120. In some embodiments, the high voltage may be between substantially 1 volt and substantially 10 volts higher than the low voltage. In some embodiments, the high voltage may be between substantially 2.5 volts and substantially 7.5 volts higher than the low voltage. In some embodiments, the high voltage may be between substantially 4 volts and substantially 6 volts higher than the low voltage. In some embodiments, the high voltage may be substantially 5 volts higher than the low voltage.

In some embodiments, antifuse transistor 102 and/or selection transistor 110 may be PMOS transistors. In contrast to antifuse 100, the altering of antifuse 400 may occur with a high voltage at source or drain 106 and a low voltage at gate 108, i.e., causing antifuse transistor 102 to be in an inversion mode.

In some embodiments, antifuse transistor 102 and/or selection transistor 110 may be finFET transistors (e.g., as illustrated and described with regard to FIG. 5).

FIG. 5 is a three-dimensional layout diagram illustrating an example finFET 500 in accordance with at least one embodiment of the disclosure. FinFET 500 includes a channel region 508 between a source or drain 502 and a source or drain 504. FinFET 500 also includes gate 506 surrounding, on three sides, a portion of channel region 508. In some embodiments, all of source or drain 502, source or drain 504, gate 506, and channel region 508 are above a substrate 510.

Figure 6:
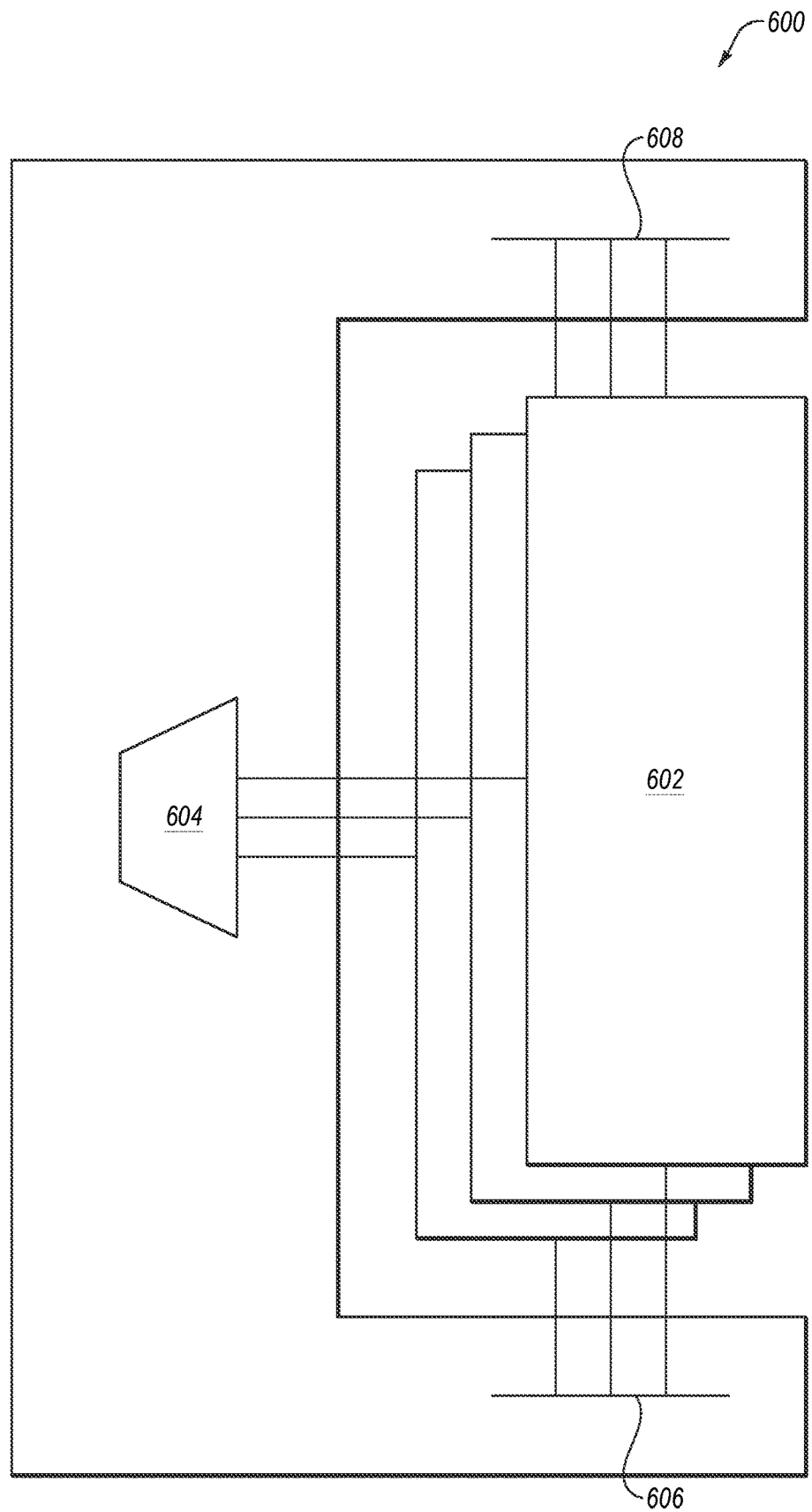
FIG. 6 is a schematic diagram illustrating an example antifuse read/write circuit in accordance with at least one embodiment of the disclosure.

FIG. 6 is a schematic diagram illustrating an example antifuse read/write circuit 600 in accordance with at least one embodiment of the disclosure. Antifuse read/write circuit 600 may include one or more antifuses 602 and may be configured to read and/or write antifuses 602. Each of antifuses 602 may be an instance of one of antifuse 100 of FIG. 1, antifuse 200 of FIG. 2, antifuse 300 of FIG. 3, antifuse 400 of FIG. 4, antifuse 1000 of FIG. 10, antifuse 1100 of FIG. 11, antifuse 1200 of FIG. 12, antifuse 1300 of FIG. 13, antifuse 1400 of FIG. 1400, or antifuse 1500 of FIG. 15.

Antifuse read/write circuit 600 includes first node 606 and second node 608 (each of which may be a bus electrically coupled to multiple antifuses 602). First node 606 may be electrically coupled to a corresponding first node (e.g., first node 118 of antifuse 100, antifuse 200, antifuse 300, or antifuse 400) of each of antifuses 602. Second node 608 may be electrically coupled to a corresponding second node (e.g., second node 120 of antifuse 100, antifuse 200, antifuse 300, or antifuse 400) of each of antifuses 602.

Antifuse read/write circuit 600 includes selection circuit 604 which may be configured to selectively provide a selection voltage to each of antifuses 602. Selection circuit 604 may be electrically coupled to a corresponding selection node (e.g., selection node 122 of antifuse 100, antifuse 200, antifuse 300, or antifuse 400) of each of antifuses 602.

Antifuse read/write circuit 600 may be configured to individually select each of antifuses 602. Antifuse read/write circuit 600 may further be configured to individually determine a state (e.g., read) of each of antifuses 602. Further, antifuse read/write circuit 600 may be configured to individually program (e.g., write) each of antifuses 602 (e.g., by providing a voltage differential between second node 608 and first node 606 sufficient to cause a breakdown in a channel region of antifuse transistor) (e.g., antifuse transistor 102 of antifuse 100, antifuse 200, antifuse 300, antifuse 400, antifuse 1000, antifuse 1100, antifuse 1200, antifuse 1300, antifuse 1400, or antifuse 1500).

Figure 7:
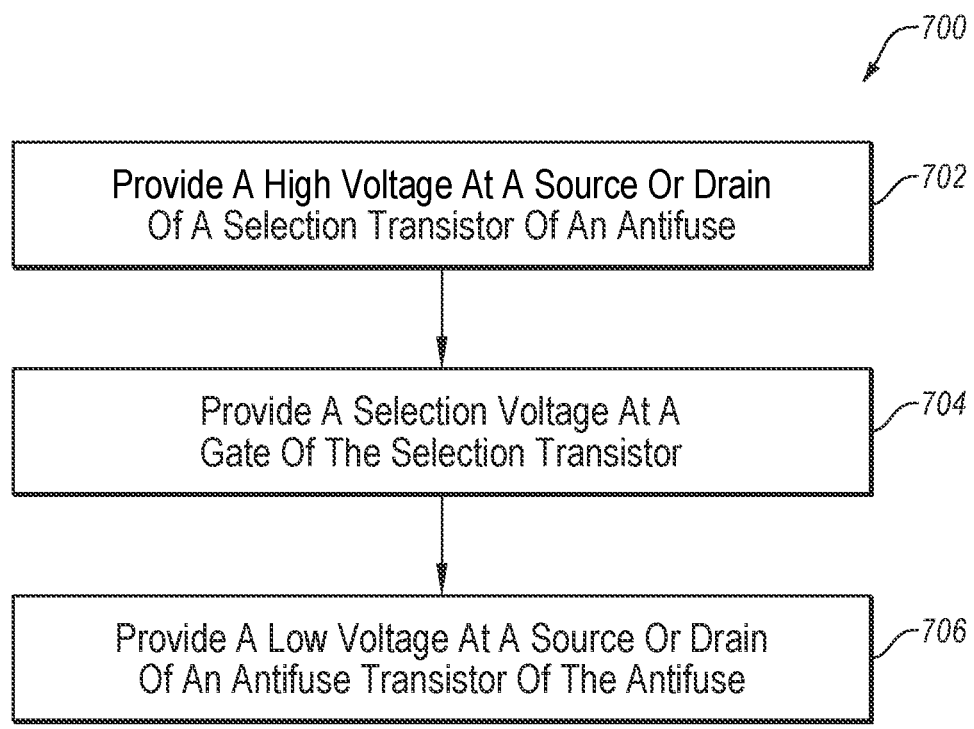
FIG. 7 is a flowchart illustrating an example method in accordance with at least one embodiment of the disclosure.

FIG. 7 is a flowchart illustrating an example method 700 in accordance with at least one embodiment of the disclosure. Method 700 may be performed, in some embodiments, at an antifuse, such as antifuse 100 of FIG. 1, antifuse 200 of FIG. 2, antifuse 300 of FIG. 3, antifuse 1000 of FIG. 10, antifuse 1100 of FIG. 11, antifuse 1200 of FIG. 12, antifuse 1300 of FIG. 13, antifuse 1400 of FIG. 1400, antifuse 1500 of FIG. 15, or another antifuse. Further, method 700 may be performed by a circuit or system, such as, antifuse read/write circuit 600, or another device or system. Although illustrated as discrete blocks, various blocks may be divided into additional blocks, combined into fewer blocks, or eliminated, depending on the desired implementation.

Figure 10:
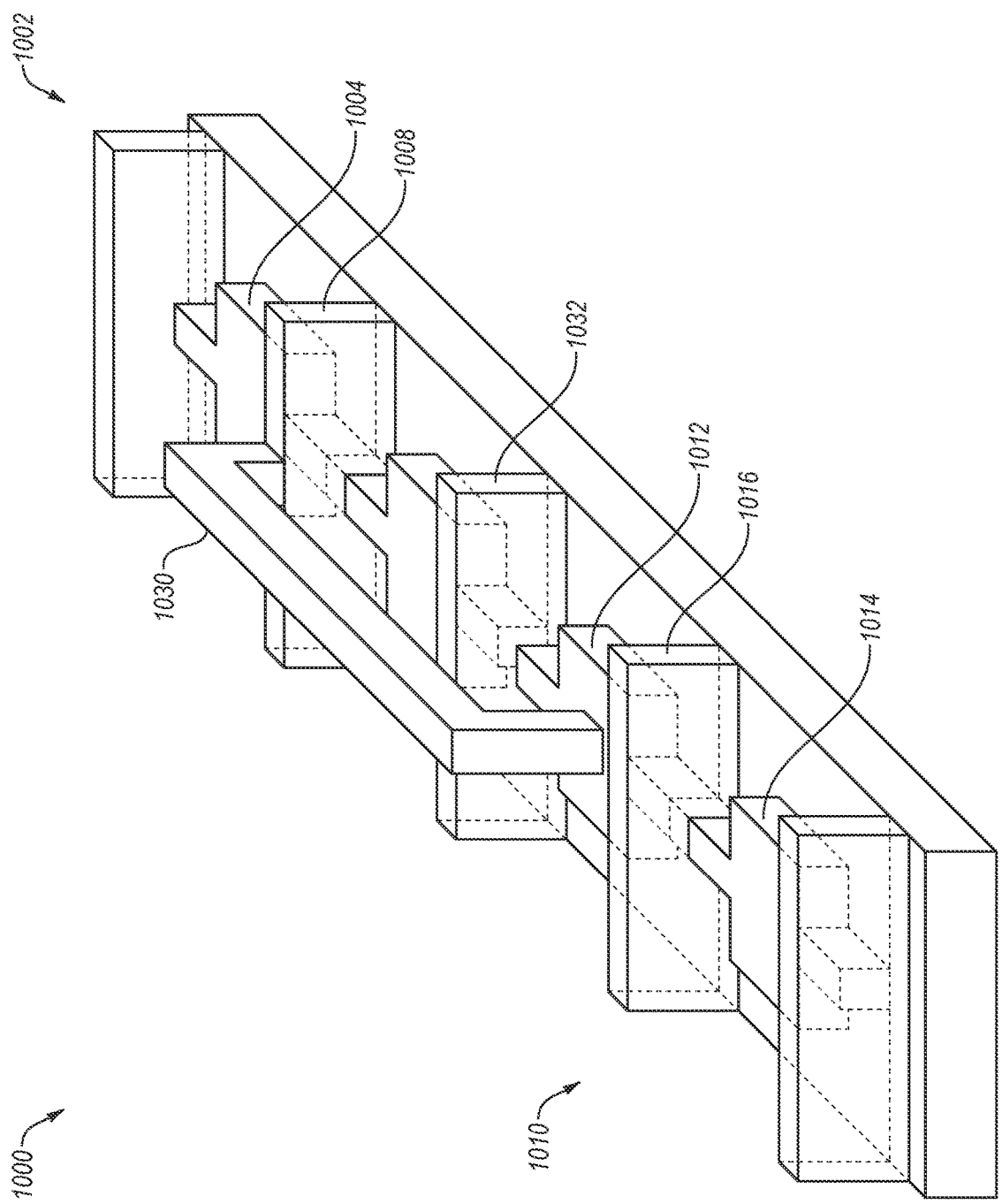
FIG. 10 is a three-dimensional layout diagram illustrating an example antifuse in accordance with at least one embodiment of the disclosure.
Figure 11:
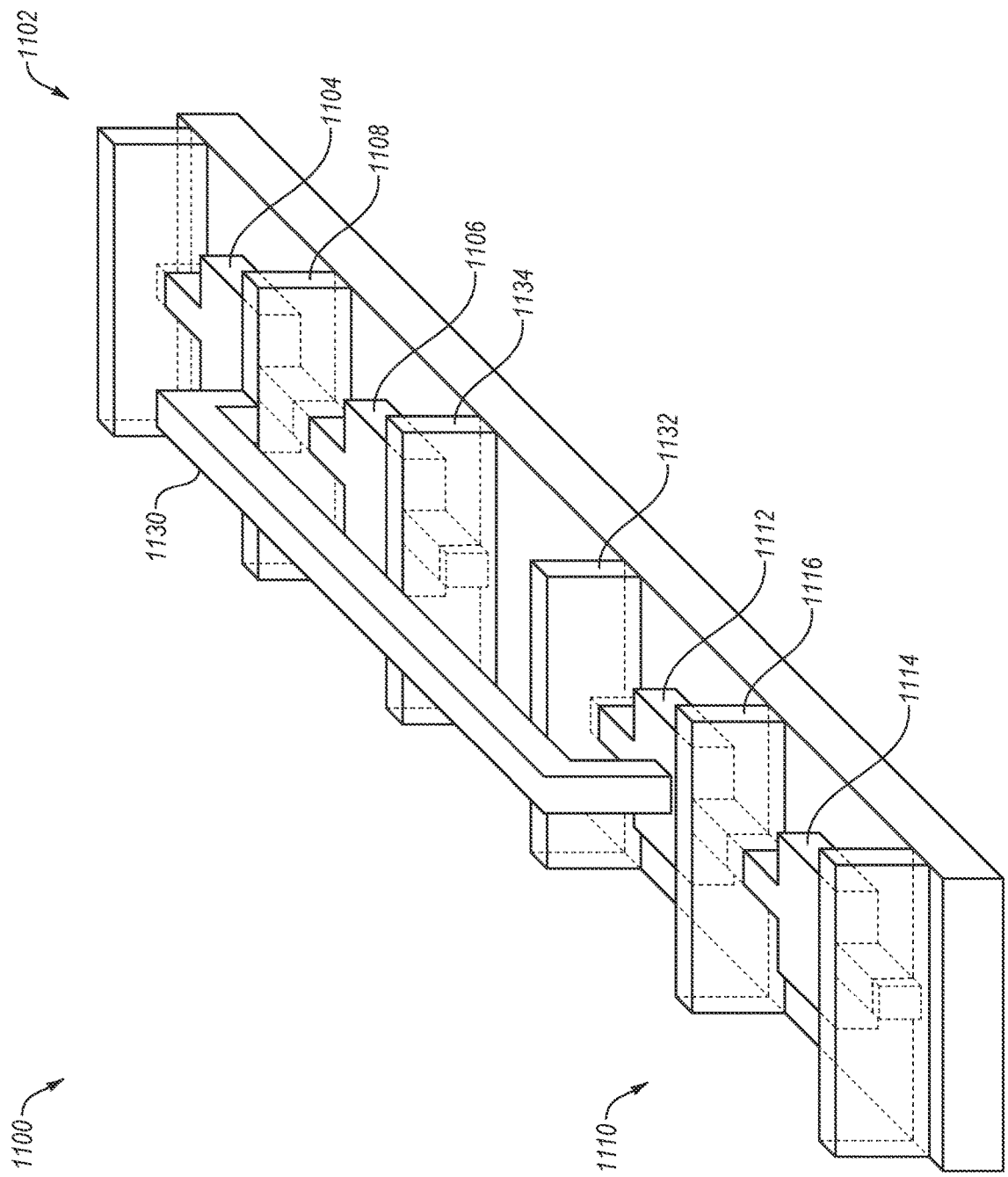
FIG. 11 is a three-dimensional layout diagram illustrating another example antifuse in accordance with at least one embodiment of the disclosure.
Figure 12:
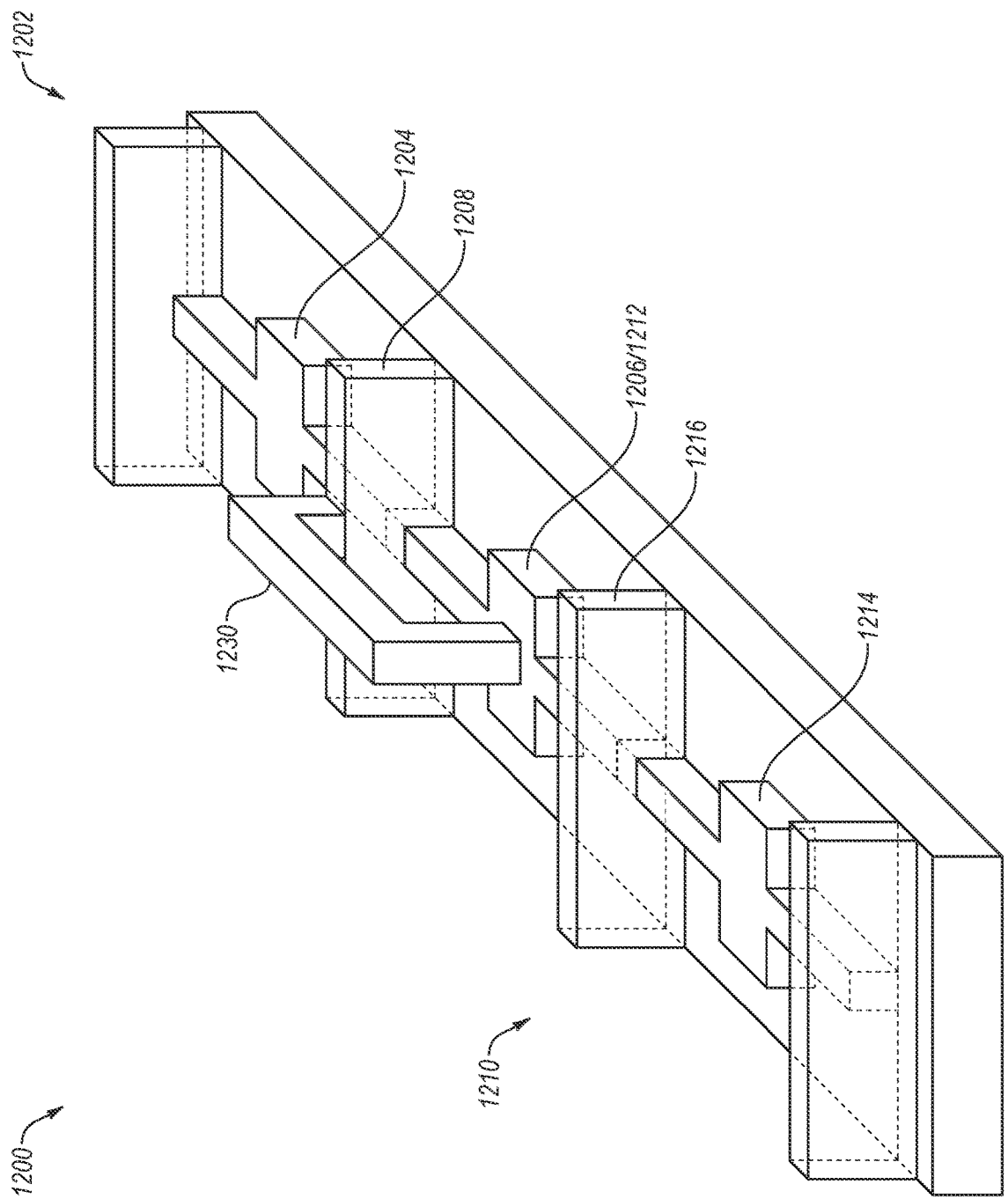
FIG. 12 is a three-dimensional layout diagram illustrating yet another example antifuse in accordance with at least one embodiment of the disclosure.
Figure 13:
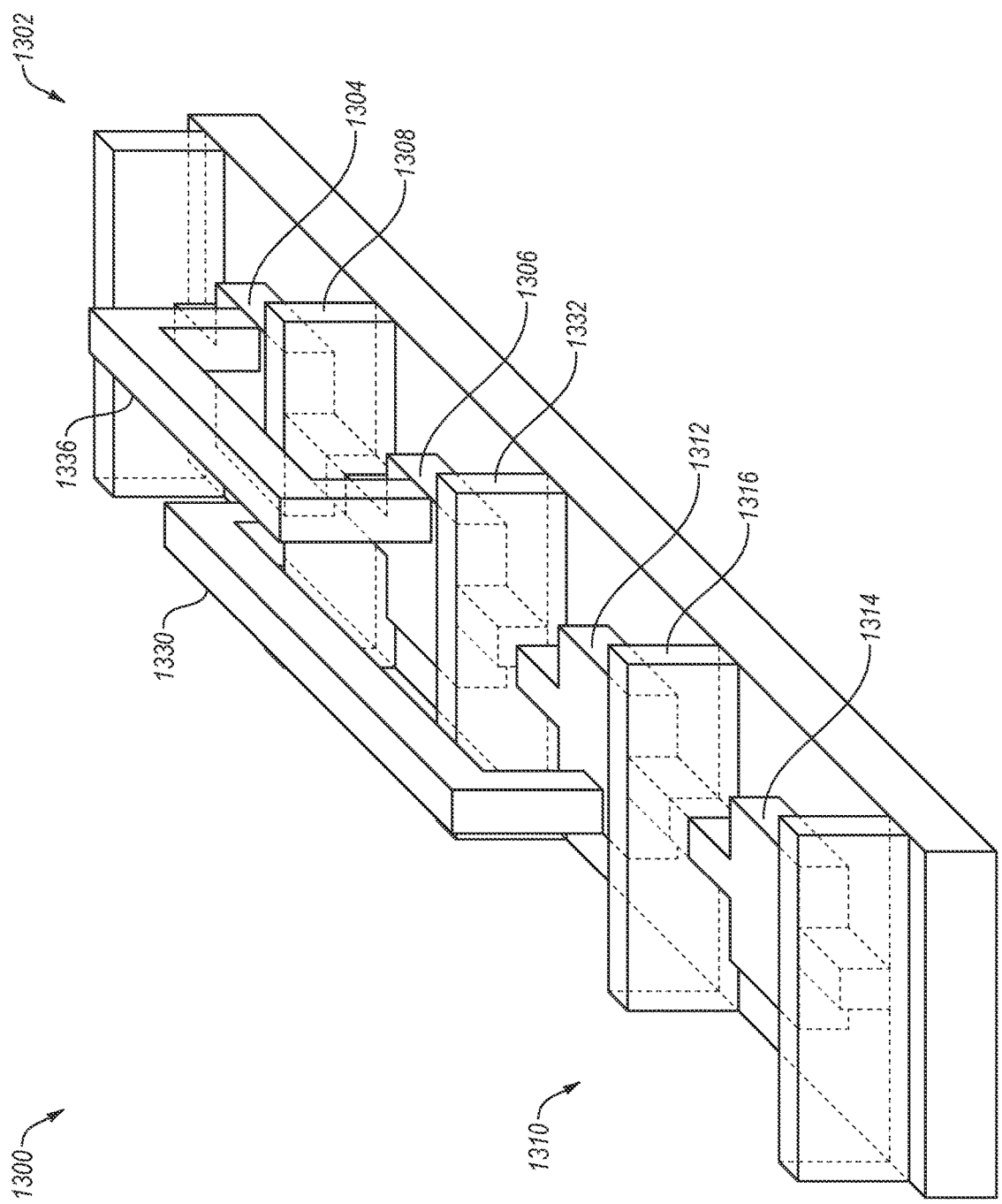
FIG. 13 is a three-dimensional layout diagram illustrating yet another example antifuse in accordance with at least one embodiment of the disclosure.

At block 702, a high voltage may be provided at a source or drain (e.g., source or drain 114 of FIG. 1, FIG. 2, FIG. 3, FIG. 10, FIG. 11, FIG. 12, FIG. 13, FIG. 14, or FIG. 15) of a selection transistor (e.g., selection transistor 110 of FIG. 1, FIG. 2, FIG. 3, FIG. 10, FIG. 11, FIG. 12, FIG. 13, FIG. 14, or FIG. 15) of an antifuse (e.g., antifuse 100 of FIG. 1, antifuse 200 of FIG. 2, antifuse 300 of FIG. 3, antifuse 1000 of FIG. 10, antifuse 1100 of FIG. 11, antifuse 1200 of FIG. 12, antifuse 1300 of FIG. 13, antifuse 1400 of FIG. 1400, or antifuse 1500 of FIG. 15).

At block 704, a selection voltage may be provided at a gate (e.g., gate 116 of FIG. 1, FIG. 2, FIG. 3, FIG. 10, FIG. 11, FIG. 12, FIG. 13, FIG. 14, or FIG. 15) of the selection transistor.

At block 706, a low voltage may be provided at a source or drain (source or drain 104 of FIG. 1, FIG. 2, FIG. 3, FIG. 10, FIG. 11, FIG. 12, FIG. 13, FIG. 14, or FIG. 15) of an antifuse transistor (e.g., antifuse transistor 102 of FIG. 1, FIG. 2, or FIG. 3, FIG. 10, FIG. 11, FIG. 12, FIG. 13, FIG. 14, or FIG. 15) of the antifuse.

Modifications, additions, or omissions may be made to method 700 without departing from the scope of the disclosure. For example, the operations of method 700 may be implemented in differing order or simultaneously. Furthermore, the outlined operations and actions are only provided as examples, and some of the operations and actions may be optional, combined into fewer operations and actions, or expanded into additional operations and actions without detracting from the essence of the disclosed embodiment.

Figure 8:
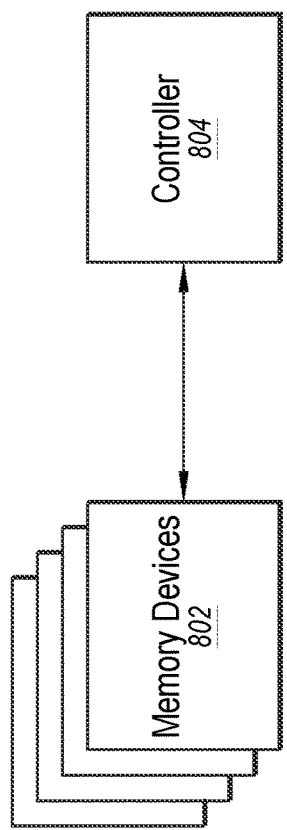
FIG. 8 is a simplified block diagram illustrating an example memory system, in accordance with at least one embodiment of the disclosure.

FIG. 8 is a simplified block diagram illustrating an example memory system 800 implemented in accordance with at least one embodiment of the disclosure. Memory system 800, which may include, for example, a semiconductor device, includes a number of memory devices 802 and a controller 804. Controller 804 may be operatively coupled with memory devices 802 so as to convey command/address signals (e.g., command/address signals received by command terminals and/or address terminals) to memory devices 802.

At least one of memory devices 802 and/or controller 804 of memory system 800 may include one or more antifuses, according to one or more embodiments disclosed herein (e.g., antifuse 100 of FIG. 1, antifuse 200 of FIG. 2, antifuse 300, of FIG. 3, antifuse 400 of FIG. 4, antifuse 1000 of FIG. 10, antifuse 1100 of FIG. 11, antifuse 1200 of FIG. 12, antifuse 1300 of FIG. 13, antifuse 1400 of FIG. 1400, or antifuse 1500 of FIG. 15), and/or one or more circuits according to one or more embodiments disclosed herein (e.g., antifuse read/write circuit 600 of FIG. 6). Additionally or alternatively, memory system 800 (or one or more of its components) may be configured to implement one or more of the methods (e.g., method 700 of FIG. 7) described in the disclosure.

Figure 9:
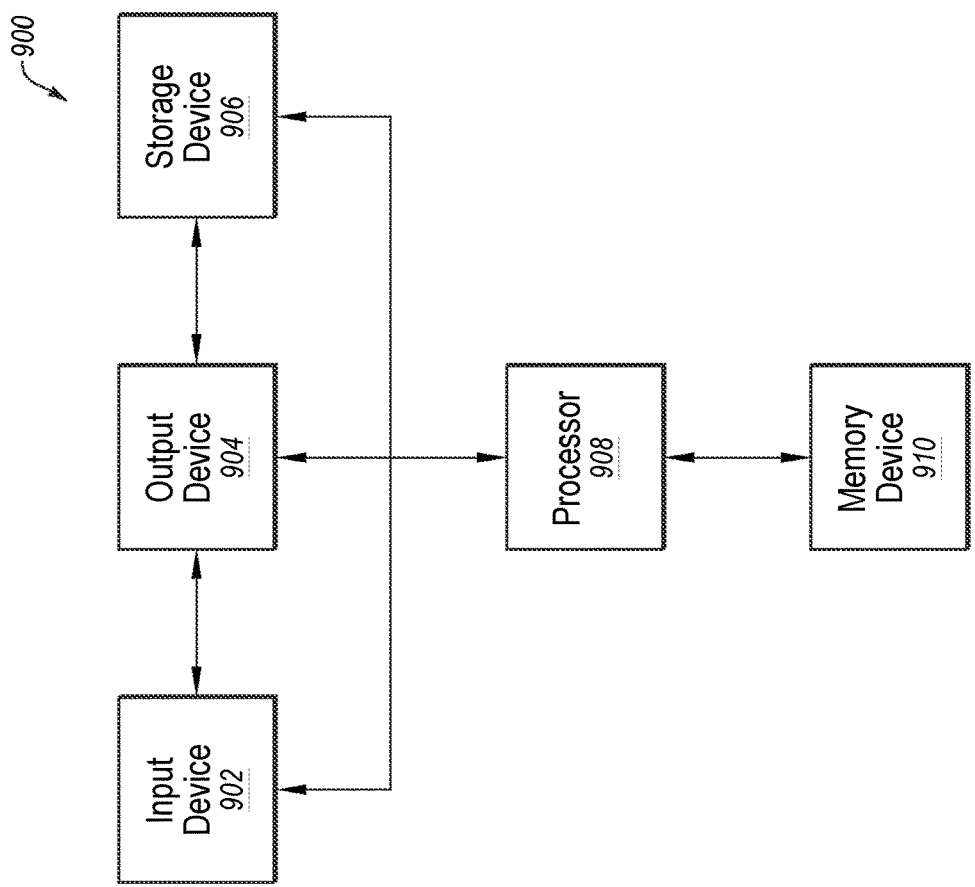
FIG. 9 is a simplified block diagram illustrating an example electronic system, in accordance with at least one embodiment of the disclosure.

FIG. 9 is a simplified block diagram illustrating an electronic system 900 implemented in accordance with at least one embodiment of the disclosure. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910 may include at least a portion of memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

FIG. 10 is a three-dimensional layout diagram illustrating an example antifuse 1000 in accordance with at least one embodiment of the disclosure. Antifuse 1000 is an example of a layout that may be used to implement antifuse 100 of FIG. 1. Thus, several elements of antifuse 1000 are the same as or substantially or substantially similar to their counterparts in antifuse 100. For example, antifuse transistor 1002 may be an example of antifuse transistor 102 of FIG. 1, source or drain 1004 may be an example of source or drain 104 of FIG. 1, gate 1008 may be an example of gate 108 of FIG. 1, selection transistor 1010 may be an example of selection transistor 110 of FIG. 1, source or drain 1012 may be an example of source or drain 112 of FIG. 1, source or drain 1014 may be an example of source or drain 114 of FIG. 1, gate 1016 may be an example of gate 116 of FIG. 1, and coupling 1030 may be an example of coupling 130 of FIG. 1.

Coupling 1030 electrically couples source or drain 1012 of selection transistor 1010 to gate 1008 of antifuse transistor 1002. Coupling 1030 may have any suitable size and may be, or may include, an interconnect jumper e.g., in one or more metal or polysilicon layers of antifuse 1000.

Antifuse 1000 includes diffusion break 1032. Diffusion break 1032 may include polysilicon between gate 1008 of antifuse transistor 1002 and source or drain 1012 of selection transistor 1010. Diffusion break 1032 may be configured to prevent charge at source or drain 1012 and/or gate 1008 from affecting the other of source or drain 1012 and/or gate 1008 and/or the channel region between source or drain 1012 and gate 1008. Diffusion break 1032 may have any suitable shape or size.

FIG. 11 is a three-dimensional layout diagram illustrating an example antifuse 1100 in accordance with at least one embodiment of the disclosure. Antifuse 1100 is another example of a layout that may be used to implement antifuse 100 of FIG. 1. Thus, several elements of antifuse 1100 are the same as or substantially or substantially similar to their counterparts in antifuse 100. For example, antifuse transistor 1102 may be an example of antifuse transistor 102 of FIG. 1, source or drain 1104 may be an example of source or drain 104 of FIG. 1, source or drain 1106 may be an example of source or drain 106 of FIG. 1, gate 1108 may be an example of gate 108 of FIG. 1, selection transistor 1110 may be an example of selection transistor 110 of FIG. 1, source or drain 1112 may be an example of source or drain 112 of FIG. 1, source or drain 1114 may be an example of source or drain 114 of FIG. 1, gate 1116 may be an example of gate 116 of FIG. 1, and coupling 1130 may be an example of coupling 130 of FIG. 1.

Coupling 1130 electrically couples source or drain 1112 of selection transistor 1110 to gate 1108 of antifuse transistor 1102. Coupling 1130 may have any suitable size and may be, or may include, an interconnect jumper e.g., in one or more metal or polysilicon layers of antifuse 1100.

Antifuse 1100 includes diffusion break 1132 and diffusion break 1134. Diffusion break 1132 and diffusion break 1134 may include polysilicon between source or drain 1106 of antifuse transistor 1102 and source or drain 1112 of selection transistor 1110. Diffusion break 1132 and diffusion break 1134 may be configured to prevent charge at source or drain 1112 and/or source or drain 1106 from affecting the other of source or drain 1112 and/or source or drain 1106 and/or the channel region between source or drain 1112 and source or drain 1106. Diffusion break 1132 and diffusion break 1134 may have any suitable shape or size.

FIG. 12 is a three-dimensional layout diagram illustrating an example antifuse 1200 in accordance with at least one embodiment of the disclosure. Antifuse 1200 is an example of a layout that may be used to implement antifuse 200 of FIG. 2. Thus, several elements of antifuse 1200 are the same as or substantially or substantially similar to their counterparts in antifuse 200. For example, antifuse transistor 1202 may be an example of antifuse transistor 102 of FIG. 2, source or drain 1204 may be an example of source or drain 104 of FIG. 2, gate 1208 may be an example of gate 108 of FIG. 2, selection transistor 1210 may be an example of selection transistor 110 of FIG. 2, source or drain 1214 may be an example of source or drain 114 of FIG. 2, gate 1216 may be an example of gate 116 of FIG. 2, and coupling 1230 may be an example of coupling 130 of FIG. 2.

Antifuse transistor 1202 includes a source or drain 1206 that may be electrically coupled to or may be formed with source or drain 1212 of selection transistor 1210. Thus, source or drain 1206/1212 as illustrated in FIG. 12 may be an example of all of source or drain 106 of FIG. 2, source or drain 112 of FIG. 2, and coupling 202 of FIG. 2.

Coupling 1230 electrically couples source or drain 1212 of selection transistor 1210 to gate 1208 of antifuse transistor 1202. Coupling 1230 may have any suitable size and may be, or may include, an interconnect jumper e.g., in one or more metal or polysilicon layers of antifuse 1200.

FIG. 13 is a three-dimensional layout diagram illustrating an example antifuse 1300 in accordance with at least one embodiment of the disclosure. Antifuse 1300 is an example of a layout that may be used to implement antifuse 300 of FIG. 3. Thus, several elements of antifuse 1300 are the same as or substantially or substantially similar to their counterparts in antifuse 300. For example, antifuse transistor 1302 may be an example of antifuse transistor 102 of FIG. 3, source or drain 1304 may be an example of source or drain 104 of FIG. 3, source or drain 1306 may be an example of source or drain 106 of FIG. 3, gate 1308 may be an example of gate 108 of FIG. 3, selection transistor 1310 may be an example of selection transistor 110 of FIG. 3, source or drain 1312 may be an example of source or drain 112 of FIG. 3, source or drain 1314 may be an example of source or drain 114 of FIG. 3, gate 1316 may be an example of gate 116 of FIG. 3, coupling 1330 may be an example of coupling 130 of FIG. 3, and coupling 1336 may be an example of coupling 302 of FIG. 3.

Coupling 1330 electrically couples source or drain 1312 of selection transistor 1310 to gate 1308 of antifuse transistor 1302. Coupling 1330 may have any suitable size and may be, or may include, an interconnect jumper e.g., in one or more metal or polysilicon layers of antifuse 1300.

Coupling 1336 electrically couples source or drain 1306 of antifuse transistor 1302 to source or drain 1304 of antifuse transistor 1302. Coupling 1336 may have any suitable size and may be, or may include, an interconnect jumper e.g., in one or more metal or polysilicon layers of antifuse 1300.

Antifuse 1300 includes diffusion break 1332. Diffusion break 1332 may include polysilicon between source or drain 1306 of antifuse transistor 1302 and source or drain 1312 of selection transistor 1310. Diffusion break 1332 may be configured to prevent charge at source or drain 1312 and/or gate 1308 from affecting the other of source or drain 1312 and/or gate 1308 and/or the channel region between source or drain 1312 and source or drain 1306. Diffusion break 1332 may have any suitable shape or size.

Figure 14:
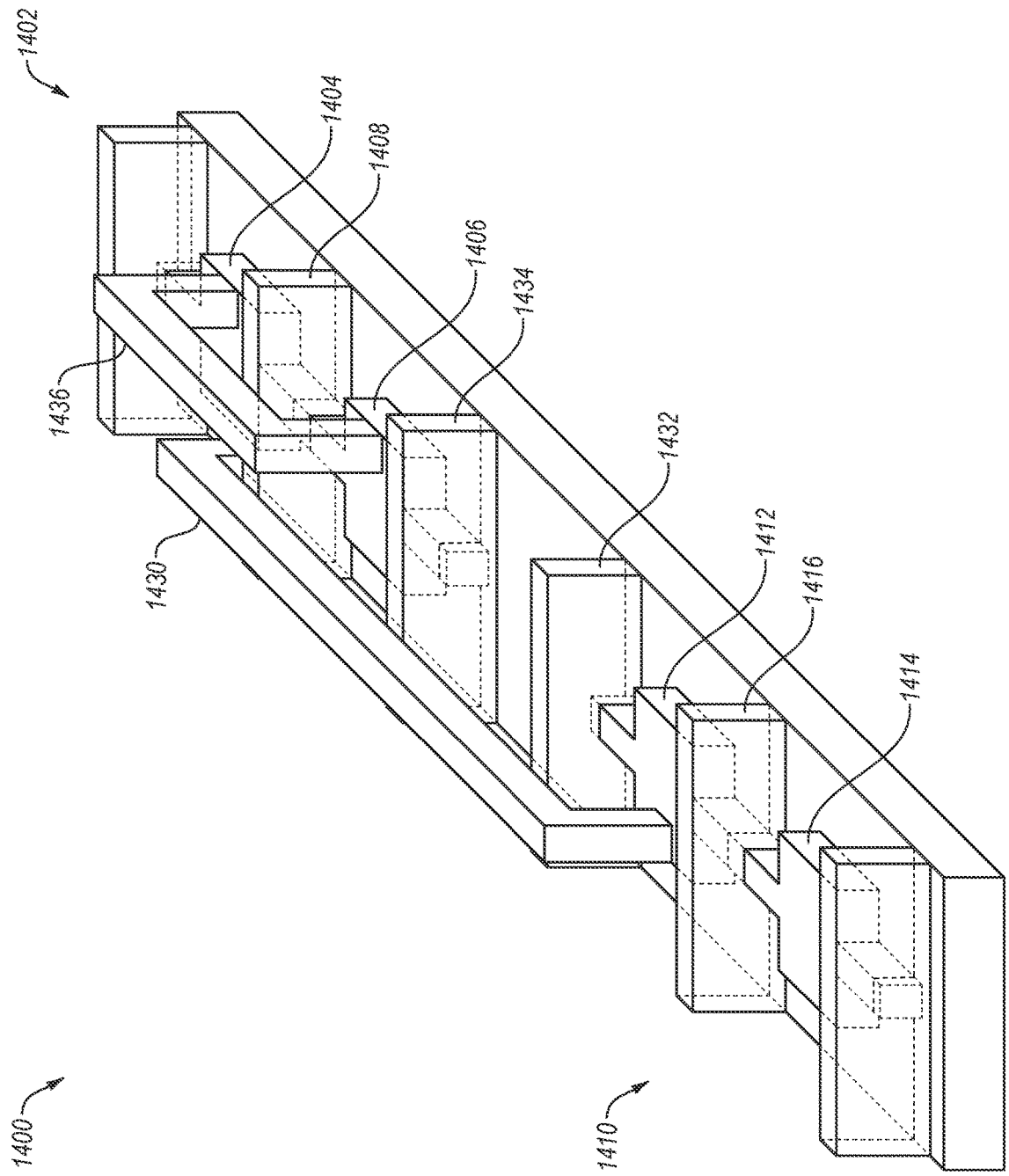
FIG. 14 is a three-dimensional layout diagram illustrating yet another example antifuse in accordance with at least one embodiment of the disclosure.

FIG. 14 is a three-dimensional layout diagram illustrating an example antifuse 1400 in accordance with at least one embodiment of the disclosure. Antifuse 1400 is another example of a layout that may be used to implement antifuse 300 of FIG. 3. Thus, several elements of antifuse 1400 are the same as or substantially or substantially similar to their counterparts in antifuse 300. For example, antifuse transistor 1402 may be an example of antifuse transistor 102 of FIG. 3, source or drain 1404 may be an example of source or drain 104 of FIG. 3, source or drain 1406 may be an example of source or drain 106 of FIG. 3, gate 1408 may be an example of gate 108 of FIG. 3, selection transistor 1410 may be an example of selection transistor 110 of FIG. 3, source or drain 1412 may be an example of source or drain 112 of FIG. 3, source or drain 1414 may be an example of source or drain 114 of FIG. 3, gate 1416 may be an example of gate 116 of FIG. 3, coupling 1430 may be an example of coupling 130 of FIG. 3, and coupling 1436 may be an example of coupling 302 of FIG. 3.

Coupling 1430 electrically couples source or drain 1412 of selection transistor 1410 to gate 1408 of antifuse transistor 1402. Coupling 1430 may have any suitable size and may be, or may include, an interconnect jumper e.g., in one or more metal or polysilicon layers of antifuse 1400.

Coupling 1436 electrically couples source or drain 1406 of antifuse transistor 1402 to source or drain 1404 of antifuse transistor 1402. Coupling 1436 may have any suitable size and may be, or may include, an interconnect jumper e.g., in one or more metal or polysilicon layers of antifuse 1400.

Antifuse 1400 includes diffusion break 1432 and diffusion break 1434. Diffusion break 1332 and diffusion break 1434 may include polysilicon between source or drain 1406 of antifuse transistor 1402 and source or drain 1412 of selection transistor 1410. Diffusion break 1432 and diffusion break 1434 may be configured to prevent charge at source or drain 1412 and/or gate 1408 from affecting the other of source or drain 1412 and/or gate 1408 and/or the channel region between source or drain 1412 and source or drain 1406. Diffusion break 1432 and diffusion break 1434 may have any suitable shape or size.

FIG. 15 is a three-dimensional layout diagram illustrating an example antifuse 1500 in accordance with at least one embodiment of the disclosure. Antifuse 1500 is an example of a layout that may be used to implement antifuse 400 of FIG. 4. Thus, several elements of antifuse 1500 are the same as or substantially or substantially similar to their counterparts in antifuse 400. For example, antifuse transistor 1502 may be an example of antifuse transistor 102 of FIG. 4, source or drain 1504 may be an example of source or drain 104 of FIG. 4, gate 1508 may be an example of gate 108 of FIG. 4, selection transistor 1510 may be an example of selection transistor 110 of FIG. 4, source or drain 1514 may be an example of source or drain 114 of FIG. 4, and gate 1516 may be an example of gate 116 of FIG. 4.

Antifuse transistor 1502 includes a source or drain 1506 that may be electrically coupled to or may be formed with source or drain 1512 of selection transistor 1510. Thus, source or drain 1506/1512 as illustrated in FIG. 15 may be an example of all of source or drain 106 of FIG. 4, source or drain 112 of FIG. 4, and the electrical coupling between source or drain 106 and source or drain 112 FIG. 4.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Various embodiments may include:

Embodiment 1: An apparatus comprising: an antifuse configurable either as a short between a first node and a second node or as an open between the first node and the second node, the antifuse comprising: a selection transistor, a source or drain of the selection transistor electrically coupled to the first node and a gate of the selection transistor configured to receive a selection voltage; and an antifuse transistor, a gate of the antifuse transistor electrically coupled the other of the source or drain of the selection transistor, a source or drain of the antifuse transistor electrically coupled to the second node.

Embodiment 2: The apparatus according to Embodiment 1, wherein the antifuse transistor comprises a first p-channel metal oxide semiconductor transistor.

Embodiment 3: The apparatus according to any of Embodiments 1 and 2, wherein the antifuse transistor is configured to be altered from being configured as an open between the first node and the second node to being configured as a short between the first node and the second node while the antifuse transistor is in an accumulation mode.

Embodiment 4: The apparatus according to any of Embodiments 1 through 3, wherein the antifuse transistor is configured to be altered from being configured as an open between the first node and the second node to being configured as a short between the first node and the second node by application of a high voltage at the first node, a low voltage at the second node, and the selection voltage at the gate of the selection transistor.

Embodiment 5: The apparatus according to any of Embodiments 1 through 4, wherein the high voltage is between substantially 2.5 volts and substantially 10 volts higher than the low voltage.

Embodiment 6: The apparatus according to any of Embodiments 1 through 5, wherein the other of the source or drain of the antifuse transistor is electrically coupled to the gate of the antifuse transistor.

Embodiment 7: The apparatus according to any of Embodiments 1 through 6, wherein the other of the source or drain of the antifuse transistor is electrically coupled to the source or drain of the antifuse transistor.

Embodiment 8: The apparatus according to any of Embodiments 1 through 7, wherein the antifuse transistor comprises a first fin field-effect transistor.

Embodiment 9: A method of programming an antifuse comprising: providing a high voltage at a source or drain of a selection transistor of the antifuse; providing a selection voltage at a gate of the selection transistor; and providing a low voltage at a source or drain of an antifuse transistor of the antifuse.

Embodiment 10: The method according to Embodiment 9, wherein providing the high voltage and providing the low voltage comprises providing the high voltage between substantially 2.5 volts and substantially 10 volts higher than the low voltage.

Embodiment 11: The method according to any of Embodiments 9 and 10, wherein the other of the source or drain of the selection transistor is electrically coupled to a gate of the antifuse transistor.

Embodiment 12: The method according to any of Embodiments 9 through 11, further comprising causing a dielectric of a channel region of the antifuse transistor to break down.

Embodiment 13: The method according to any of Embodiments 9 through 12, wherein causing the dielectric of the channel region of the antifuse transistor to break down comprises causing the dielectric of the channel region of the antifuse transistor to break down while the antifuse transistor is in an accumulation mode.

Embodiment 14: The method according to any of Embodiments 9 through 13, wherein the antifuse transistor is a fin field-effect transistor and a channel region of the antifuse transistor protrudes between portions of a gate of the antifuse transistor.

Embodiment 15: An apparatus comprising: a selection circuit; a number of antifuses arranged between a first node and a second node, each of the number of antifuses selectable by the selection circuit, each of the number of antifuses configurable either as a short between the first node and the second node or as an open between the first node and the second node, each of the number of antifuses comprising: a selection transistor, a source or drain of the selection transistor electrically coupled to the first node and a gate of the selection transistor electrically coupled to the selection circuit; and an antifuse transistor, a gate of the antifuse transistor electrically coupled the other of the source or drain of the selection transistor, a source or drain of the antifuse transistor electrically coupled to the second node.

Embodiment 16: The apparatus according to Embodiment 15, wherein an antifuse of the number of antifuses is configured to be programmed from being configured as an open between the first node and the second node to being configured as a short between the first node and the second node in response to a high voltage at the first node, a low voltage at the second node, and the antifuse being selected via the selection circuit.

Embodiment 17: The apparatus according to any of Embodiments 15 and 16, wherein the high voltage is between substantially 2.5 volts and substantially 10 volts higher than the low voltage.

Embodiment 18: The apparatus according to any of Embodiments 15 through 17, further comprising a circuit configured to determine a state of an antifuse of the number of antifuses by measuring voltage or current between the first node and the second node and selecting the antifuse using the selection circuit.

Embodiment 19: The apparatus according to any of Embodiments 15 through 18, wherein the other of the source or drain of the antifuse transistor is electrically coupled to the gate of the antifuse transistor.

Embodiment 20: The apparatus according to any of Embodiments 15 through 19, wherein the other of the source or drain of the antifuse transistor is electrically coupled to the source or drain of the antifuse transistor.

Embodiment 21: An apparatus comprising: an antifuse configurable as either a short between a first node and a second node or an open between the first node and the second node and configured to be altered from being as an open between the first node and the second node to being as a short between the first node and the second node by application of a high voltage at a first voltage and a low voltage at the second node, the antifuse comprising: a selection transistor, a source or drain of the selection transistor electrically coupled to the first node and a gate of the selection transistor configured to receive a selection voltage; and an antifuse transistor, a gate of the antifuse transistor electrically coupled to the second node a source or drain of the antifuse transistor electrically coupled to the other of the source or drain of the selection transistor.

Embodiment 22: The apparatus according to Embodiment 21, wherein the antifuse transistor comprises a first p-channel metal oxide semiconductor transistor.

Embodiment 23: The apparatus according to any of Embodiments 21 and 22, wherein the antifuse transistor is configured to be altered from being configured as an open between the first node and the second node to being configured as a short between the first node and the second node while the antifuse transistor is in an inversion mode.

Embodiment 24: The apparatus according to any of Embodiments 21 through 23, wherein the high voltage is between substantially 2.5 volts and substantially 10 volts higher than the low voltage.

Embodiment 25: The apparatus according to any of Embodiments 21 through 24, wherein the antifuse transistor comprises a first fin field-effect transistor.

Embodiment 26: A method of programming an antifuse comprising: providing a high voltage at a source or drain of a selection transistor of the antifuse; providing a selection voltage at a gate of the selection transistor; and providing a low voltage at a gate of an antifuse transistor of the antifuse.

Embodiment 27: The method according to Embodiment 26, wherein the other of the source or drain of the selection transistor is electrically coupled to a source or drain of the antifuse transistor.

Embodiment 28: The method according to any of Embodiments 26 and 27, further comprising causing a dielectric of a channel region of the antifuse transistor to break down.

Embodiment 29: The method according to any of Embodiments 26 through 28, wherein providing the high voltage and providing the low voltage comprises providing the high voltage between substantially 2.5 volts and substantially 10 volts higher than the low voltage.

Embodiment 30: The method according to any of Embodiments 26 through 29, wherein the antifuse transistor is a fin field-effect transistor and a channel region of the antifuse transistor protrudes between portions of a gate of the antifuse transistor.

Embodiment 31: The method according to any of Embodiments 26 through 30, wherein the antifuse transistor comprises a first p-channel metal oxide semiconductor transistor.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An apparatus comprising:
an antifuse configurable either as a short between a first node and a second node or as an open between the first node and the second node, the antifuse comprising:
a selection transistor, a source or drain of the selection transistor electrically coupled to the first node and a gate of the selection transistor configured to receive a selection voltage;
an antifuse transistor, a gate of the antifuse transistor electrically coupled to the other of the source or drain of the selection transistor, a source or drain of the antifuse transistor electrically coupled to the second node; and
an electrically conductive coupling element extending from the source or drain of the antifuse transistor to an other source or drain of the antifuse transistor,
wherein the antifuse transistor comprises a fin field-effect transistor.

2. The apparatus of claim 1, wherein the antifuse transistor comprises a first p-channel metal oxide semiconductor transistor.

3. The apparatus of claim 2, wherein the antifuse transistor is configured to be altered from being configured as an open between the first node and the second node to being configured as a short between the first node and the second node while the antifuse transistor is in an accumulation mode.

4. The apparatus of claim 1, wherein the antifuse transistor is configured to be altered from being configured as an open between the first node and the second node to being configured as a short between the first node and the second node by application of a high voltage at the first node, a low voltage at the second node, and the selection voltage at the gate of the selection transistor.

5. The apparatus of claim 4, wherein the high voltage is between substantially 2.5 volts and substantially 10 volts higher than the low voltage.

6. The apparatus of claim 1, wherein an other of the source or drain of the antifuse transistor is electrically coupled to the gate of the antifuse transistor.

7. A method of programming an antifuse comprising:
providing a high voltage at a source or drain of a selection transistor of the antifuse;
providing a selection voltage at a gate of the selection transistor; and
providing a low voltage at a source or drain of an antifuse transistor of the antifuse,
wherein the antifuse comprises an electrically conductive coupling element extending from the source or drain of the antifuse transistor to an other source or drain of the antifuse transistor, and
wherein the antifuse transistor comprises a fin field-effect transistor.

8. The method of claim 7, wherein providing the high voltage and providing the low voltage comprises providing the high voltage between substantially 2.5 volts and substantially 10 volts higher than the low voltage.

9. The method of claim 7, wherein the other of the source or drain of the selection transistor is electrically coupled to a gate of the antifuse transistor.

10. The method of claim 7, further comprising causing a dielectric of a channel region of the antifuse transistor to break down.

11. The method of claim 10, wherein causing the dielectric of the channel region of the antifuse transistor to break down comprises causing the dielectric of the channel region of the antifuse transistor to break down while the antifuse transistor is in an accumulation mode.

12. The method of claim 7, wherein a channel region of the antifuse transistor protrudes between portions of a gate of the antifuse transistor.

13. An apparatus comprising:
a selection circuit;
a number of antifuses arranged between a first node and a second node, each of the number of antifuses selectable by the selection circuit, each of the number of antifuses configurable either as a short between the first node and the second node or as an open between the first node and the second node, each of the number of antifuses comprising:
a selection transistor, a source or drain of the selection transistor electrically coupled to the first node and a gate of the selection transistor electrically coupled to the selection circuit;
an antifuse transistor, a gate of the antifuse transistor electrically coupled the other of the source or drain of the selection transistor, a source or drain of the antifuse transistor electrically coupled to the second node; and
an electrically conductive coupling element extending from the source or drain of the antifuse transistor to an other source or drain of the antifuse transistor,
wherein the antifuse transistor comprises a fin field-effect transistor.

14. The apparatus of claim 13, wherein an antifuse of the number of antifuses is configured to be programmed from being configured as an open between the first node and the second node to being configured as a short between the first node and the second node in response to a high voltage at the first node, a low voltage at the second node, and the antifuse being selected via the selection circuit.

15. The apparatus of claim 14, wherein the high voltage is between substantially 2.5 volts and substantially 10 volts higher than the low voltage.

16. The apparatus of claim 13, further comprising a circuit configured to determine a state of an antifuse of the number of antifuses by measuring voltage or current between the first node and the second node and selecting the antifuse using the selection circuit.

17. The apparatus of claim 13, wherein an other of the source or drain of the antifuse transistor is electrically coupled to the gate of the antifuse transistor.

18. The apparatus of claim 13, wherein an other source or drain of the antifuse transistor is electrically coupled to the source or drain of the antifuse transistor.

* * * * *